(12) United States Patent
Huang et al.

(10) Patent No.: US 6,413,861 B1
(45) Date of Patent: Jul. 2, 2002

(54) METHOD OF FABRICATING A SALICIDE OF AN EMBEDDED MEMORY

(75) Inventors: Chong-Jen Huang, San-Chung; Hsin-Huei Chen, Miao-Li Hsien; Chih-Hao Wang, Tao-Yuan Hsien; Kuang-Wen Liu, Nan-Tao Hsien, all of (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/836,210

(22) Filed: Apr. 18, 2001

(51) Int. Cl.⁷ .............................................. H01L 21/44
(52) U.S. Cl. .................. 438/682; 438/647; 438/663; 438/651; 438/664; 438/648; 438/684; 438/216
(58) Field of Search ................................ 438/664, 524, 438/592, 279, 305, 283, 530, 755, 595, 647, 663, 651, 648, 682, 684, 685, 216

(56) References Cited

U.S. PATENT DOCUMENTS 6,124,640 A * 9/2000 Sahota et al. ............... 257/758
6,194,297 B1 * 2/2001 Cheng ......................... 438/592
6,265,292 B1 * 7/2001 Parat et al. .................. 438/524
6,312,995 B1 * 11/2001 Yu .............................. 438/283
6,335,248 B1 * 1/2002 Mandelman et al. ........ 438/279
6,335,254 B1 * 1/2002 Trivedi ........................ 438/305

* cited by examiner

Primary Examiner—Matthew Smith
Assistant Examiner—V. Yevsikov
(74) Attorney, Agent, or Firm—Winston Hsu

(57) ABSTRACT

A memory array region and a periphery circuit region are defined on a silicon substrate of a semiconductor wafer. A plurality of gates is formed on the silicon substrate in both the memory array region and the periphery circuit region. A barrier layer and a dielectric layer are formed, respectively, on the semiconductor wafer. Therein, the barrier layer covers the gates and the barrier layer fills a space between two gates. Following that, the dielectric layer atop each gate is removed and the dielectric layer remaining in the space between two gates is aligned to the surface of the gates. A photoresist layer is formed to cover the memory array region followed by an etching process to remove the dielectric layer and the barrier layer down to the surface of the silicon substrate. The photoresist layer and the barrier layer atop the gate in the memory array region are removed. Finally, a salicide process is performed.

9 Claims, 7 Drawing Sheets

METHOD OF FABRICATING A SALICIDE OF AN EMBEDDED MEMORY

BACKGROUND OF THE INVENTION

1. Field of the Invention

The present invention relates to a method of fabricating a self-aligned silicide (salicide) of an embedded memory.

2. Description of the Prior Art

Dynamic random access memory comprises a memory array region and a logic circuit region. With increasing integration, the present trend of manufacturing semiconductor integrated circuits is to integrate memory array region and high-speed logic circuit elements into a single chip. An embedded memory with both the integration of the memory array region and the logic circuits, significantly reduces the circuit area and increases the signal processing speed.

Please refer to FIG. 1 to FIG. 6. FIG. 1 to FIG. 6 are schematic diagrams of a method for fabricating silicide layers 22 and 44 of an embedded memory according to the prior art. As shown in FIG. 1, a semiconductor wafer 10 comprising a substrate 12, a memory array region 14 and a periphery circuit region 16 defined on the substrate 12 is provided. The memory array region 14 performs data storage and the periphery circuit region 16 controls logic circuits. A plurality of shallow trench isolation (STI) structures 17 is positioned within the substrate 12 to isolate the elements.

At the first step of the prior method, a thermal oxidation process is performed to grow a dielectric layer of silicon dioxide on the substrate 12, functioning as a gate oxide layer 18. Then, a chemical vapor deposition (CVD) process is performed to deposit a doped polysilicon layer 20, a silicide layer 22 and a cap layer 24 of silicon nitride, respectively, on the gate oxide layer 18. Subsequently, a photoresist layer 26 is formed on the cap layer 26 followed by the use of a lithographic process to pattern the photoresist layer 26 and thus define the positions for forming gates.

As shown in FIG. 2, using the patterned photoresist layer 26 as a mask layer, a dry etching process is performed to remove the cap layer 24, silicide layer 22 and polysilicide layer 20 down to the surface of the gate oxide layer 18. Thereafter, as shown in FIG. 3, the photoresist layer 26 is completely removed, and a plurality of gates 28 is formed on the substrate 12 in the memory array region 14, while a plurality of gates 30 is formed on the substrate 12 in the periphery circuit region 16 simultaneously. Therein, the silicide layer 22 combines with the doped polysilicon layer 20 to form a polycide layer as a primary conductive layer for each gate 28 and 30. Following this, another photoresist layer is formed to cover the memory array region 14. An ion implantation process is thereafter performed to simply form a doped area (not shown) on the substrate 12 adjacent to the gate 30 in the periphery circuit region 16. After the photoresist layer is removed, a rapid thermal processing (RTP) is employed, such as to drive dopants in the doped area into the substrate 12, to form a lightly doped drain (LDD) 32 in each MOS transistor in the periphery circuit region 16.

As shown in FIG. 4, a silicon nitride layer (not shown) is deposited on the surface of the semiconductor wafer 10. An anisotropic etching process is performed to etch back a portion of the silicon nitride layer and thus form spacers 34 and 36 on opposite sides of the gates 28 and 30, respectively. Then, as shown in FIG. 5, a photoresist layer 38 is formed to cover all the gates 28 in the memory array region 14. An ion implantation process is performed to implant the substrate 12 not covered by the photoresist layer 38 in the periphery circuit region 16. As a result, a doped area (not shown) is formed on the substrate 12 in opposite sides of each gate 30. Thereafter, another rapid thermal processing is used to drive dopants in the doped area into the substrate 12, thus producing a source and a drain 40 for each MOS transistor in the periphery circuit region 16.

As shown in FIG. 6, a dielectric layer 42 is formed on the surface of the substrate 12 in the memory array region 14. Then, using the dielectric layer 42 as a mask, a salicide process is performed to simply form a salicide layer 44 on the surfaces of the source and drain 40 in the periphery circuit region 16. Therein, the salicide process comprises: sputtering a titanium (Ti) layer (not shown) of 200 to 500 angstroms (Å) on the total surface of the substrate 12, followed by the use of a RTP process to react the titanium layer with the silicon surface of the source and drain 40, and thus forming the salicide layer 44 of titanium silicide.

In order to integrate a gate process in both the memory array region 14 and the periphery circuit region 16, the prior method uses a polycide layer as a primary conductive layer for the gate 28 and 30. The polycide layer prevents resistance of the gate from increasing, while increasing the ICs integration and shrinking the line width of gate. In addition, in order to improve the electrical performance of the elements in the periphery circuit region 16, a salicide process is used to form the salicide layer 44 on the surfaces of the source and drain 40. However, the polycide layer formed by a deposition process has a higher resistance, and thus is less ideal for improving the electrical performance of the periphery circuit region 16. On the other hand, in order to reduce gate resistance and current leakage effectively, two salicide processes are used. As a result, a salicide layer as a conductive layer for each gate in both the memory array region 14 and the periphery circuit region 16, is formed by the first salicide process. Another salicide layer on the source and drain 40 in the periphery circuit region 16 is thereafter formed by the second salicide process. However, using two salicide processes not only increases production cost but also wastes the thermal budget for the fabrication of an embedded memory.

SUMMARY OF THE INVENTION

It is therefore an objective of the present invention to provide a method of fabricating a salicide to improve the electrical performance of an embedded memory.

It is another objective of the present invention to provide a method of fabricating a salicide to decrease both production costs and wastage of thermal budget.

According to the claimed invention, a semiconductor wafer with a memory array region and a periphery circuit region defined on a silicon substrate of the semiconductor wafer is provided. A plurality of gates is also formed on the silicon substrate in both the memory array region and the periphery circuit region. Then, a barrier layer is formed on the total surface of the semiconductor wafer and covers each gate in both the memory array region and the periphery circuit region. Subsequently, a dielectric layer is formed on the barrier layer and fills a space between two gates. Using the barrier layer atop each gate in both the memory array region and the periphery circuit region as an end-point, a chemical mechanical polishing (CMP) process is thereafter performed to remove the dielectric layer atop the gates. After the CMP process, the surface of the remaining dielectric layer positioned between two gates is aligned with top surfaces of the gates. Following this, a lithographic process is performed to define a position for forming the salicide layer with a photoresist layer covering the memory array region and portions of the periphery circuit region. Using the photoresist layer as a mask, an etching process is performed to remove the dielectric layer and the barrier layer to expose the silicon substrate that is used to form the salicide layer. Finally, after the photoresist layer and the barrier layer atop each gate in the memory array region are removed, a salicide process is performed. As a result, a salicide layer is formed atop each gate and the substrate surface adjacent to the gates in the periphery circuit region, and another salicide layer is formed atop each gate in the memory array region simultaneously.

It is an advantage of the present invention that gates in both the memory array region and the periphery circuit region are formed in a single gate process. In addition, salicide layers in both the memory array region and the periphery circuit region are formed in a single salicide process. Hence, only a salicide process is needed to form a conductive layer with a lower resistance to improve the electrical performance for the each gate. Furthermore, production cost and waste of thermal budget by using two silicide processes, such as taught by the prior art, are efficiently decreased according to the present invention, so thereby enhancing competence of the manufacturer.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
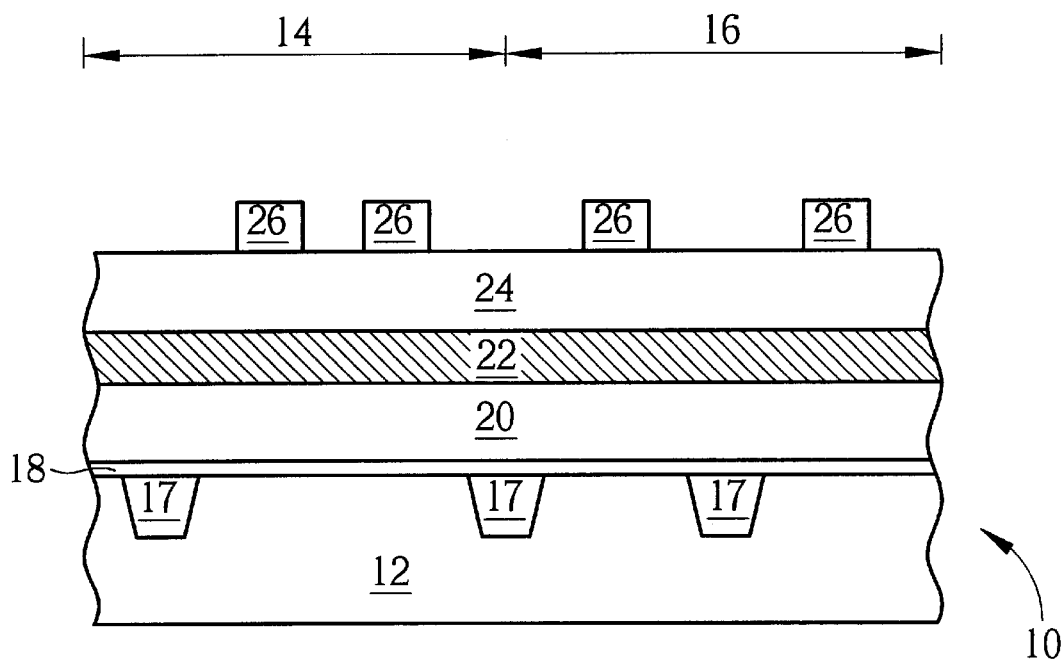
FIG. 1 to FIG. 6 are schematic diagrams of a prior art of fabricating a silicide layer of an embedded memory.
Figure 2:
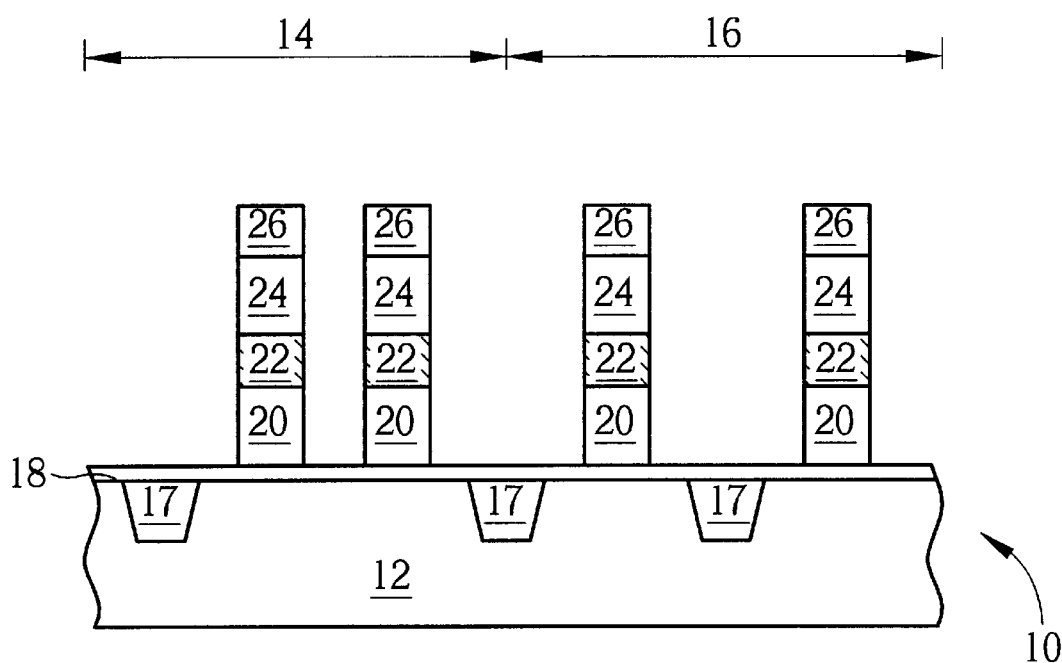
Figure 3:
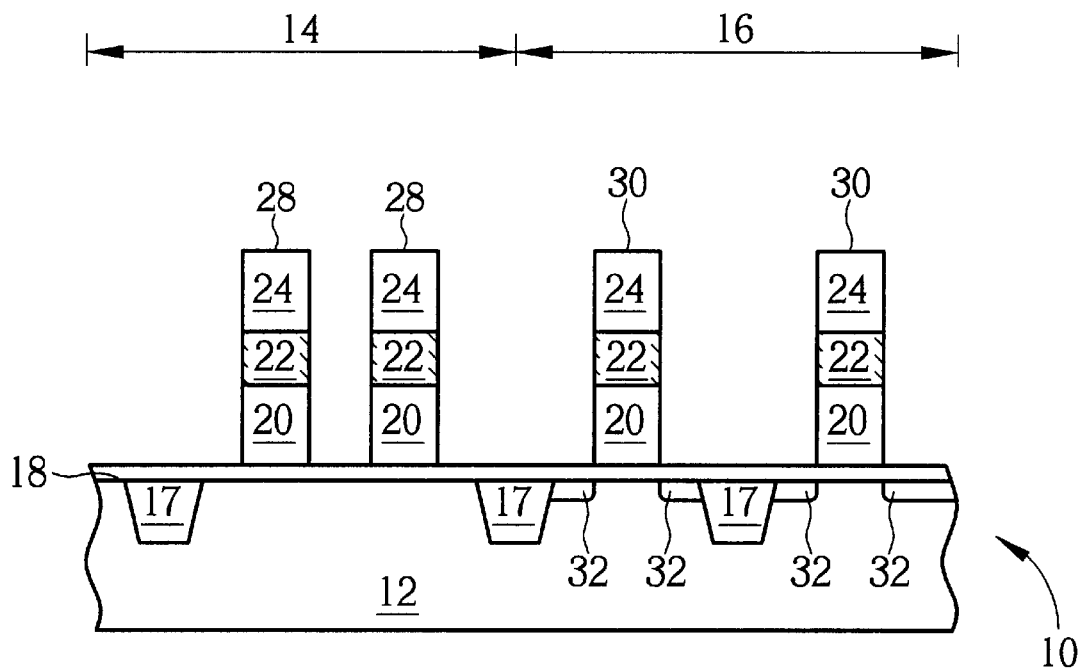
Figure 4:
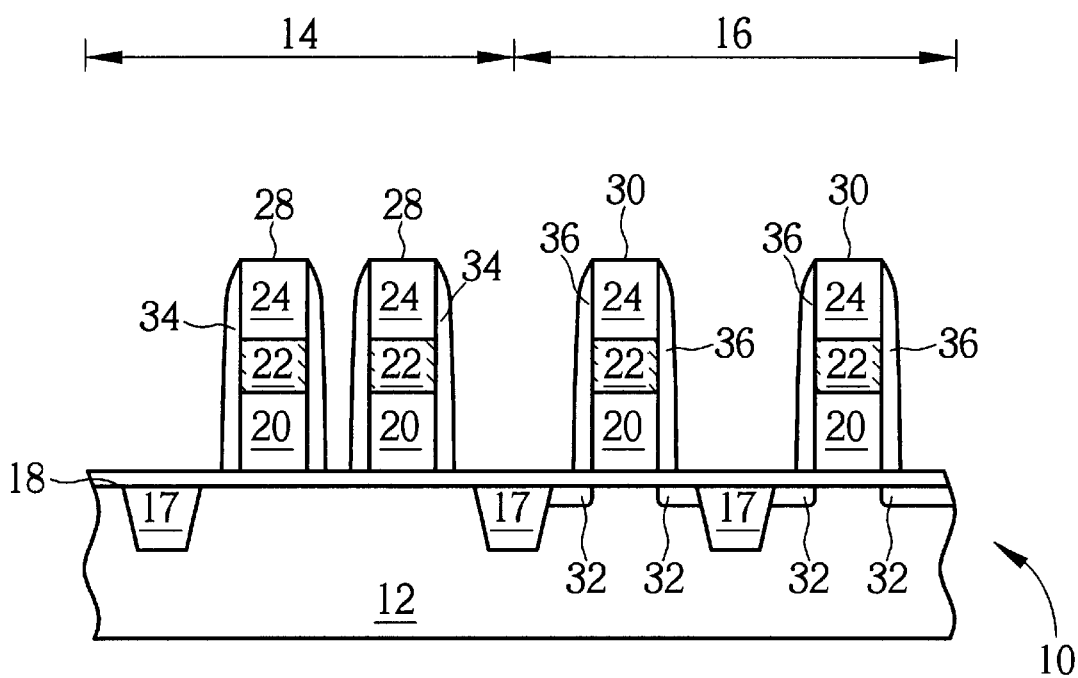
Figure 5:
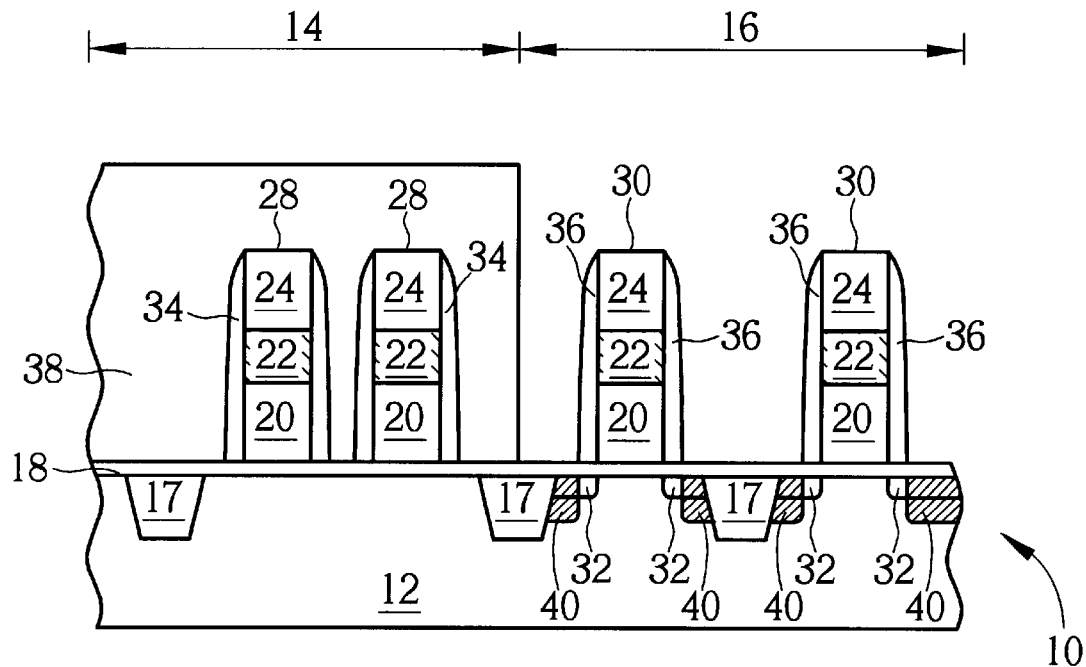
Figure 6:
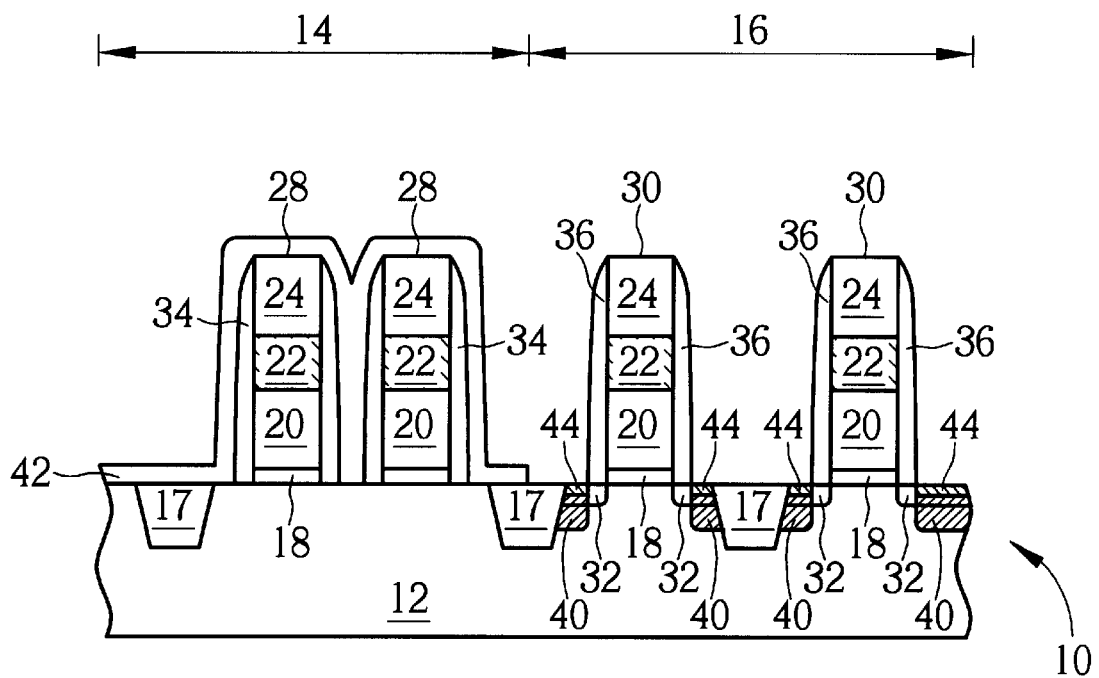
Figure 7:
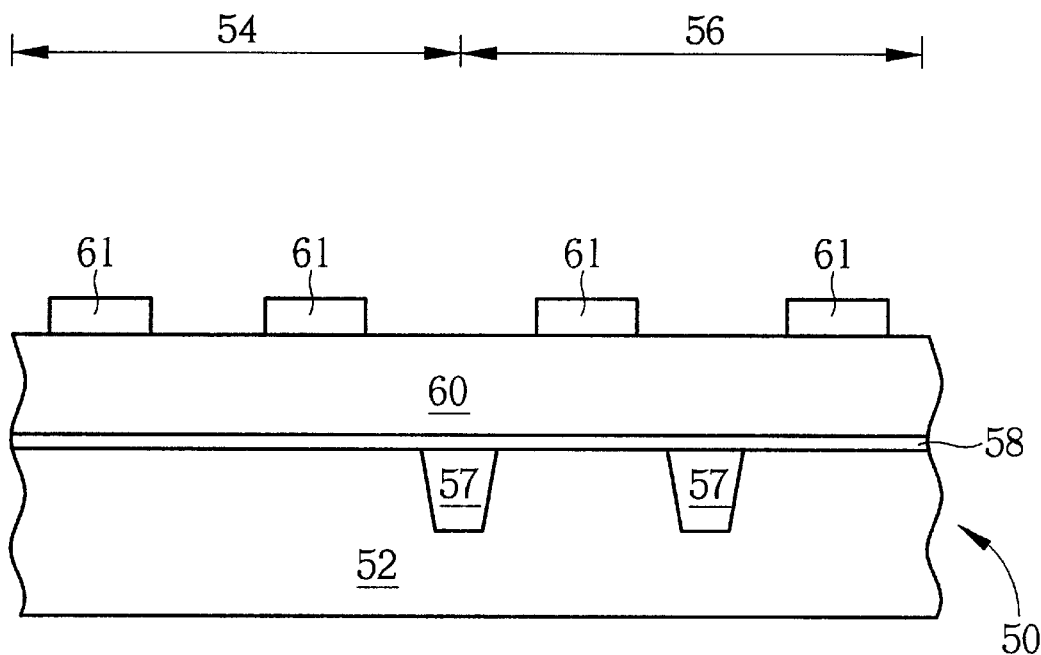
FIG. 7 to FIG. 14 are schematic diagrams of a method of fabricating a salicide layer of an embedded memory according to the present invention.

Please refer to FIG. 7 to FIG. 14. FIG. 7 to FIG. 14 are schematic diagrams of a method of fabricating salicide layers 80 and 82 of an embedded memory according to the present invention. As shown in FIG. 7, a semiconductor wafer 50 comprising a substrate 52, a memory array region 54 and a periphery circuit region 56 defined on the substrate 52 is provided. The memory array region 54 performs data storage and the periphery circuit region 56 controls logic circuits. In a preferred embodiment of the present invention, the substrate 52 comprises a P-well (not shown) for forming a plurality of NMOS transistors and an N-well (not shown) for forming a plurality of PMOS transistors. In addition, a plurality of shallow trench isolation (STI) structures 57 is also formed within the substrate 52 as an insulating layer of the elements.

Figure 8:
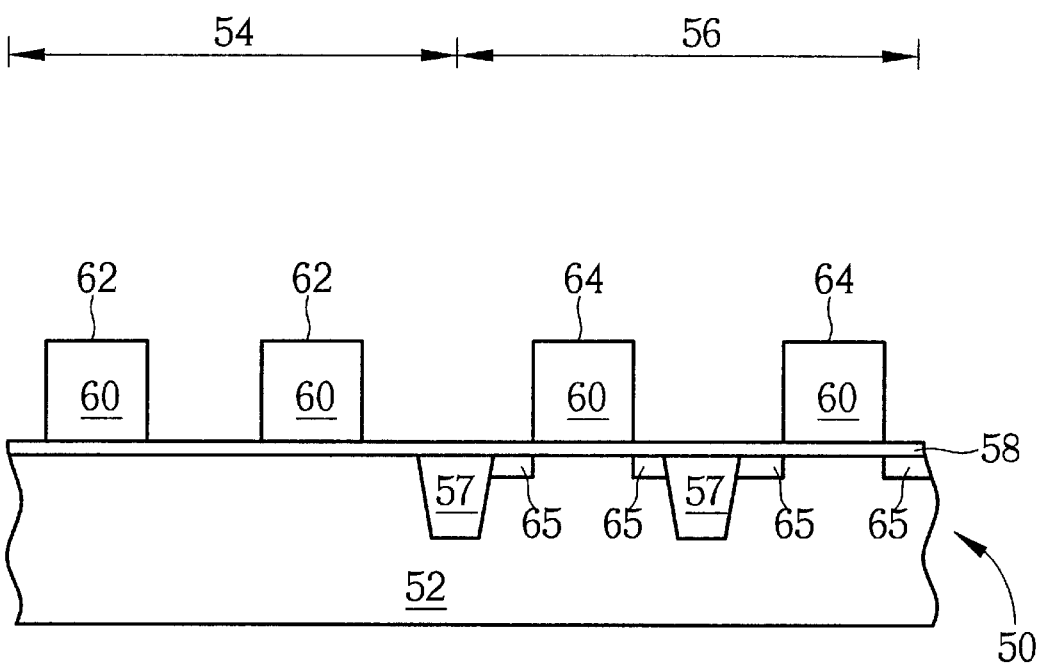

At the first step of the method according to the present invention, a gate oxide layer 58 is formed on the total surface of the semiconductor wafer 50 followed by the deposition of a doped polysilicon layer 60 on the gate oxide layer 58. Next, a photoresist layer 61 is formed on the doped polysilicon layer 60 and patterned by a lithographic process. As shown in FIG. 8, using the patterned photoresist layer 61 as a mask, the doped polysilicon layer 60 is removed down to the surface of the gate oxide layer 58. After the photoresist layer 61 is removed, a plurality of gates 62 is thus formed in the memory array region 54 while at the same time a plurality of gates 64 is formed in the periphery circuit region 56.

Figure 9:
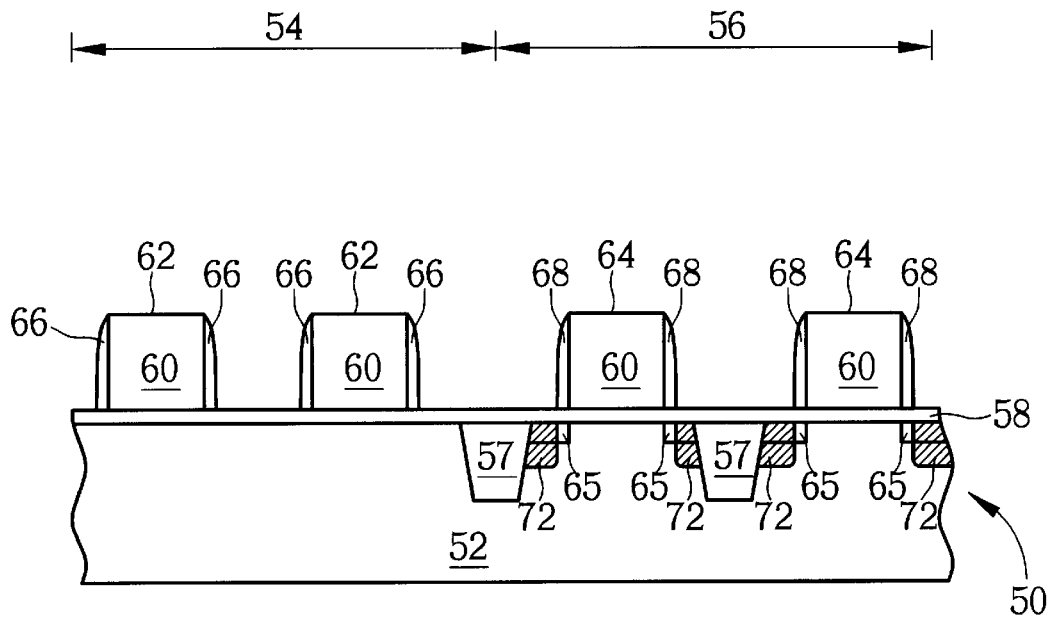

As shown in FIG. 9, another photoresist layer (not shown) is formed to cover the memory array region 54, followed by the use of N-type dopants and P-type dopants to lightly implant the P-well and N-well, respectively, in the periphery circuit region 56. As a result, a lightly doped area (not shown) is formed on the substrate 52 adjacent to the gate 64 in the periphery circuit region 56. After the photoresist layer is removed, a rapid thermal process is used to activate dopants in the lightly doped area to form a lightly doped drain (LDD) 65. Subsequently, a silicon nitride layer (not shown) is formed on the total surface of the semiconductor wafer 50 followed by an etching process to etch back a portion of the silicon nitride layer. A portion of the silicon nitride layer remains on opposite sides of the gates 62 and 64, thus forming spacers 66 and 68, respectively.

Following that, another photoresist layer is again formed to cover the gates 62 and substrate 52 in the memory array region 54. Thereafter, N-type dopants and P-type dopants are used, respectively, to heavily implant the P-well and N-well in the periphery circuit region 56. As a result, a heavily doped area (not shown) is formed on the substrate 52 outside the spacer 68 in the periphery circuit region 56. After the photoresist layer is removed, another rapid thermal processing is used to activate dopants in the heavily doped area to form a source and drain 72 for each MOS transistor in the periphery circuit region 56.

Figure 10:
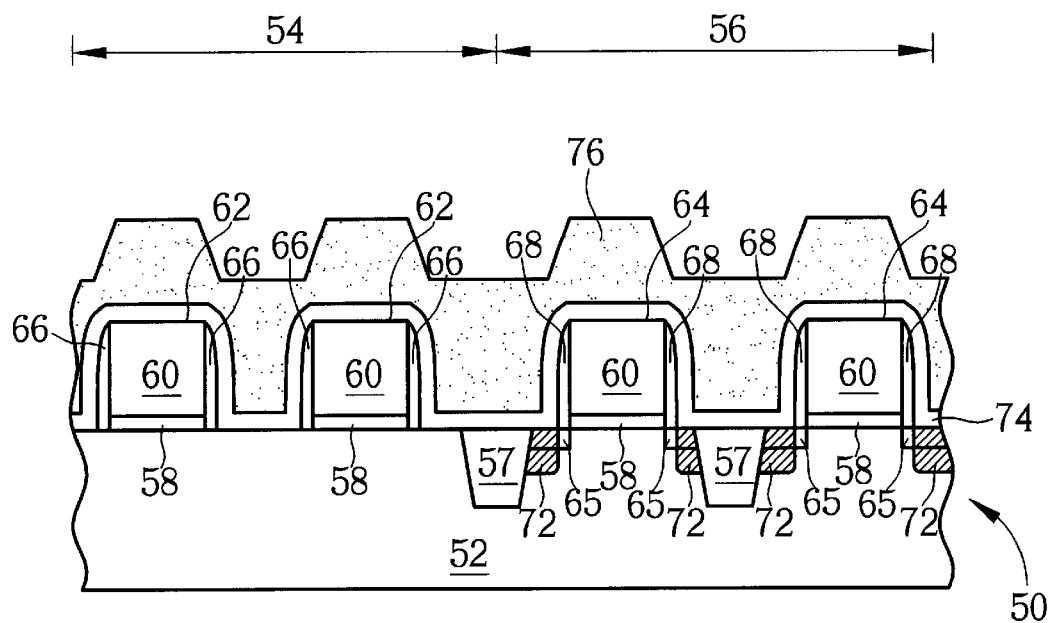

As shown in FIG. 10, plasma-enhanced chemical vapor deposition (PECVD) is performed to form a silicon oxygen nitride (SiON) layer as a barrier layer 74 on the total surface of the semiconductor wafer 50. Therein, a deposition thickness of the barrier layer 74 ranges from 200 to 500 angstroms to cover the gates 62 and 64. Next, a high-density plasma chemical vapor deposition (HDP CVD) process is performed to form a dielectric layer 76, such as a silicon dioxide layer on the surface of the barrier layer 74. A deposition thickness of the dielectric layer 76 ranging from 1000 to 3000 angstroms completely fills a space between two gates 62 or two gates 64.

Figure 11:
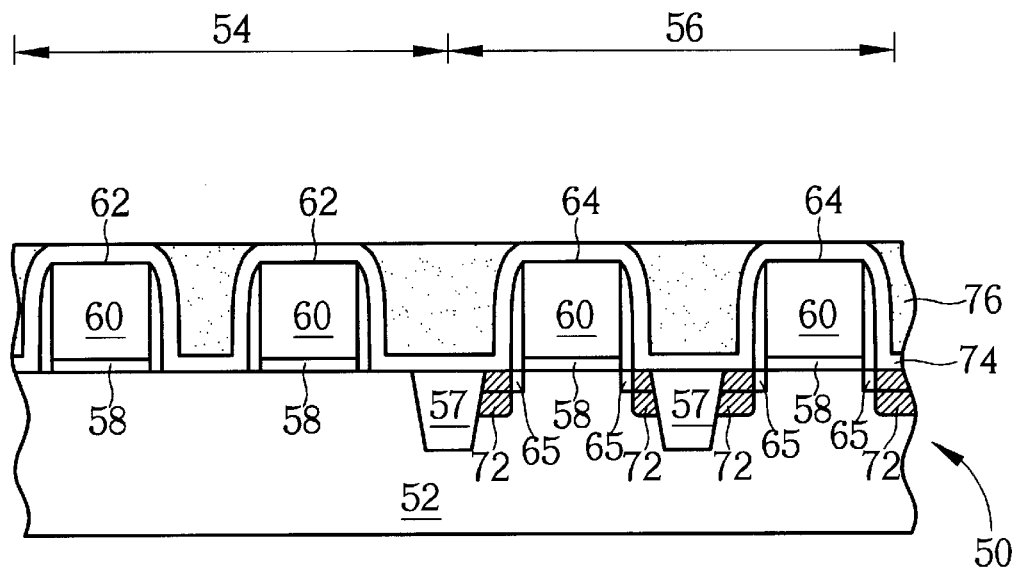

As shown in FIG. 11, a planarization process, such as chemical mechanical polishing (CMP), is performed. Using the barrier layer 74 atop the gates 62 and 64 as a polishing end-point, the dielectric layer 76 atop the gates 62 and 64 is removed during the planarization process. A portion of the dielectric layer 76 remains in the space between two gates 62 or two gates 64 after the planarization process, and has a surface almost flush with the top surfaces of the gates 62 and 64.

Figure 12:
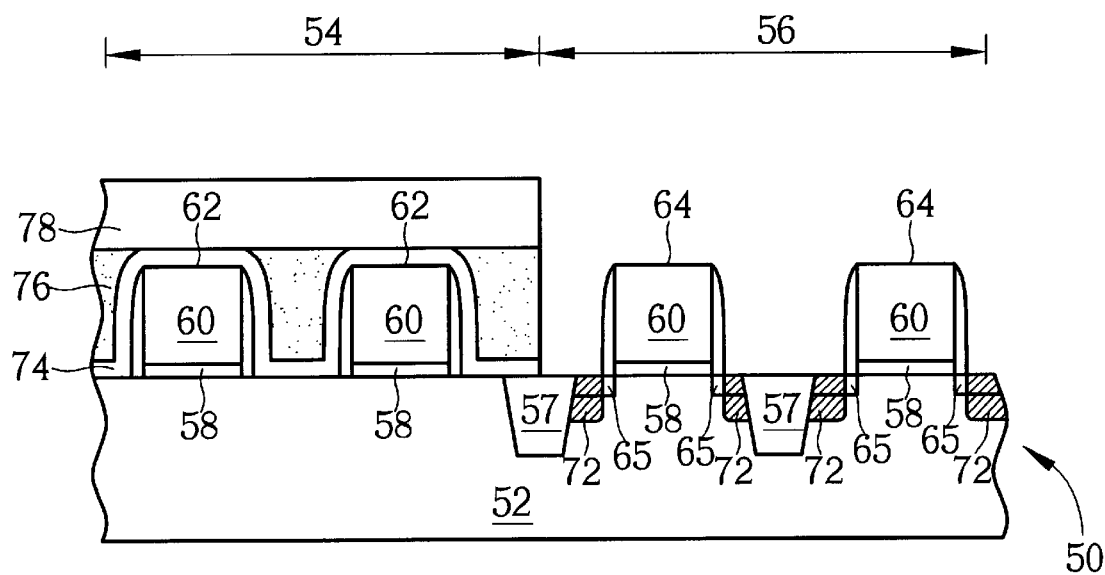

Next, as shown in FIG. 12, a photoresist layer (not shown) is formed on the surface of the semiconductor wafer 50. A lithographic and etching process is performed to remove a portion of the photoresist layer in the periphery circuit region 56 to define a position for forming the salicide layer 82. Thereafter, using the remaining photoresist layer 78 in the memory array region 54 and the remaining photoresist layer (not shown) covering the region which is not used for forming the salicide layer 82 in the periphery circuit region 56 as a mask, a two-step etching process is performed to remove the dielectric layer 76 and the barrier layer 74 in the periphery circuit region 56 down to the surface of the substrate 52. The two-step etching process includes a first etching process and a second etching process. The first etching process uses the barrier layer 74 in the periphery circuit region 56 as a stop layer and a high etching rate selectivity of silicon oxygen nitride (the barrier layer 74) to silicon oxide (the dielectric layer 76), thus selectively etching the dielectric layer 76 away in the region for forming the salicide layer 82. The second etching process uses a high etching rate selectivity of silicon oxygen nitride (the barrier layer 74) to polysilicon (the substrate 52 and the gate 64) and silicon dioxide (the STI structures 57), thus selectively etching the barrier layer 74 away in the region for forming the salicide layer 82 in the periphery circuit region 56. As a result, damage to the STI structures 57 and gates 64 is prevented.

Figure 13:
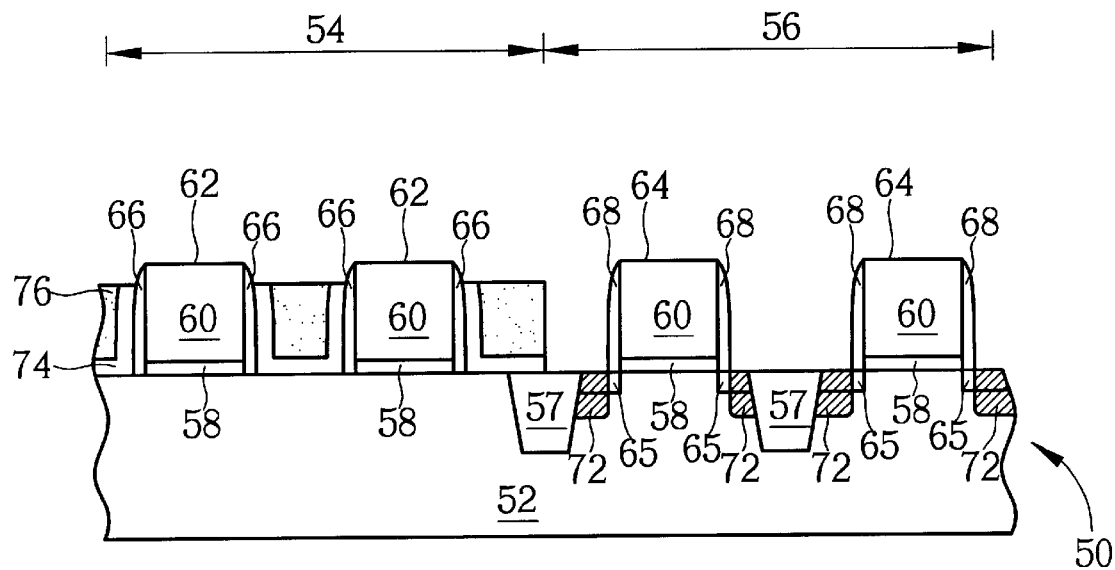

As shown in FIG. 13, the photoresist layer 78 covering the memory array region 54 and the photoresist layer covering the region, not forming the salicide layer 82 in the periphery circuit region 56, is removed. Then, a cleaning process is performed using hydrofluoric acid (HF) to clean the semiconductor wafer 50 and to remove the barrier layer 74 atop the gate 62 in the memory array region 54. During the cleaning process, a native oxide layer positioned on the substrate 52 for forming the salicide layer 82 in the periphery circuit region 56 is also removed, thus exposing the substrate 52 for forming the salicide layer 82.

Figure 14:
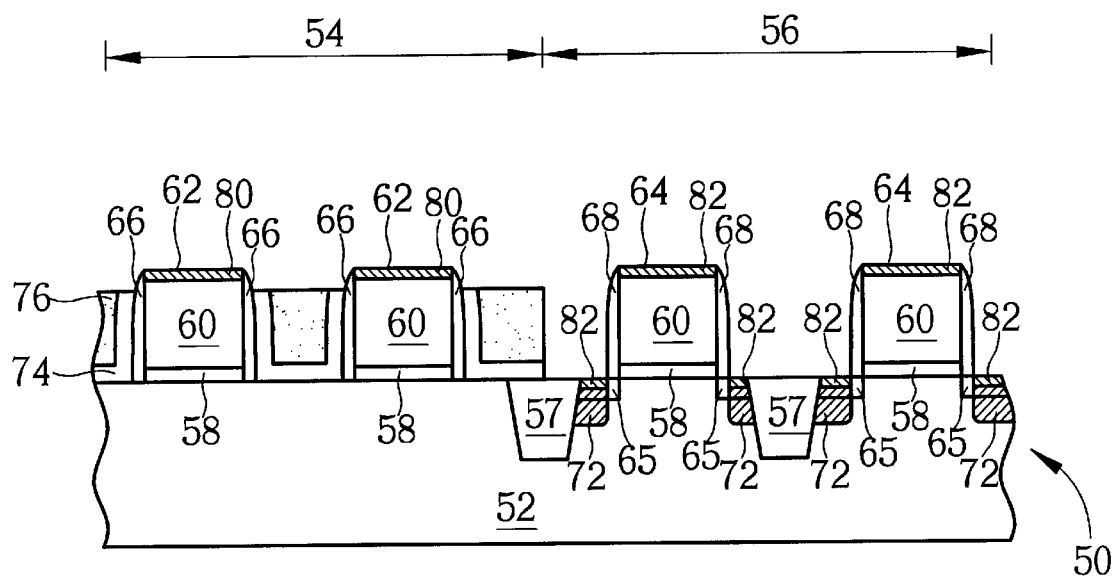

As shown in FIG. 14, a sputtering method is used to deposit a titanium layer (not shown) with a thickness of 200 to 500 angstroms on the total surface of the semiconductor wafer 50. Then, a rapid thermal processing is performed to react the titanium layer with the silicic surfaces of the gate 62 in the memory array region 54 and the gate 64, source and drain 72 in the periphery circuit region 56. As a result, salicide layers 80 and 82 are formed in the memory circuit region 54 and the periphery circuit region 56, respectively. In other embodiments of the present invention, salicide layers 80 and 82 may be composed of cobalt (Co) or nickel (Ni) with silicon.

The present invention uses a photoresist layer as a mask to etch the dielectric layer 76 and the barrier layer 74 not covered by the photoresist layer and positioned outside the gate 64 in the periphery circuit region 56. Hence, after the photoresist layer is removed, only a single salicide process is needed to simultaneously form the salicide layer 80 on the gate 62 in the memory array region 54, and form the salicide layer 82 on the surfaces of the gate 64, the source and drain 72 in the periphery circuit region 56. The salicide process thus lowers the resistance of each MOS transistor in both the memory array region 54 and the periphery circuit region 56.

In contrast to the prior art of forming a silicide layer of an embedded memory, the method of the present invention requires only one salicide process. Thus, a salicide layer with a lower resistance than the polycide, is formed on the gate in the memory array region, and on the surfaces of the gate, source and drain in the periphery circuit region simultaneously. As a result, the sheet resistance of the gate is decreased to improve the electrical performance of the memory. In addition, production cost and waste of thermal budget are decreased in comparison to using two silicide processes to separately form the silicide layers on the gate, and on the source and drain in the periphery circuit region, as in the prior art.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a salicide layer of an embedded memory, the method comprising:
   providing a semiconductor wafer comprising a silicon substrate, a memory array region and a periphery circuit region defined on the substrate;
   forming a plurality of gates on the silicon substrate of both the memory array region and the periphery circuit region;
   forming a barrier layer on the semiconductor wafer to cover each gate in the memory array region and in the periphery circuit region;
   forming a dielectric layer on the barrier layer, the dielectric layer filling a space between two gates;
   performing a chemical mechanical polishing (CMP) process with the barrier layer atop each gate as an end point to remove the dielectric layer atop the gates, and to align the dielectric layer remaining between two gates with the surfaces of the two gates;
   forming a photoresist layer on the semiconductor wafer to at least cover the memory array region;
   using the photoresist layer as a mask to perform an etching process to remove the dielectric layer and the barrier layer down to the surface of the silicon substrate;
   removing the photoresist layer and the barrier layer atop each gate of the memory array region; and
   performing a salicide process to simultaneously form a salicide layer atop each gate of the memory array region, on the substrate adjacent to each gate of the periphery circuit region, and atop each gate of the periphery circuit region.

2. The method of claim 1 wherein the photoresist layer covers the periphery circuit region excluding regions for forming the salicide layer.

3. The method of claim 1 wherein the memory array region is used for forming a metal-oxide semiconductor (MOS) transistor of a nitride read only memory (NROM).

4. The method of claim 1 wherein each gate comprises a spacer on opposite sides of the gate.

5. The method of claim 1 wherein the barrier layer comprises silicon oxygen nitride (SiON).

6. The method of claim 1 wherein the dielectric layer is a silicon oxide layer formed by a high-density plasma chemical vapor deposition (HDP CVD) method.

7. The method of claim 1 wherein the etching process comprises:
   using the barrier layer as a stop layer to remove the dielectric layer in the periphery circuit region; and
   removing the barrier layer in the periphery circuit region for forming the salicide layer of the periphery circuit region.

8. The method of claim 1 wherein each gate of the periphery region comprises at least a source and a drain within the silicon substrate adjacent to the gate.

9. The method of claim 1 wherein the salicide layer comprises titanium (Ti), cobalt (Co) or nickel (Ni) together with silicon.

* * * * *